United States Patent [19]

Stefan

[11] 4,424,480

[45] Jan. 3, 1984

[54] PROCESS FOR THE MEASUREMENT OF THE SPECIFIC CAPACITY OF A CABLE AND A DEVICE FOR CARRYING OUT THE PROCESS

[75] Inventor: Zgorski Stefan, Biel, Switzerland

[73] Assignee: Zumbach Electronic AG, Orpund, Switzerland

[21] Appl. No.: 462,903

[22] Filed: Feb. 1, 1983

Related U.S. Application Data

[63] Continuation of Ser. No. 193,662, Oct. 3, 1980, abandoned.

[30] Foreign Application Priority Data

Oct. 15, 1979 [CH] Switzerland .................. 9260/79

[51] Int. Cl.³ .......................................... G01R 11/52
[52] U.S. Cl. .................................. 324/60 C; 264/40.2
[58] Field of Search ............... 264/40.2; 324/60 C, 324/60 R

[56] References Cited

U.S. PATENT DOCUMENTS

| | | | |
|---|---|---|---|
| 3,433,858 | 3/1969 | Bauer | 264/40.2 |
| 3,459,851 | 8/1969 | Macpherson | 324/60 R X |
| 3,748,577 | 7/1973 | Jones | 264/40.2 |
| 3,914,357 | 10/1975 | Cereijo | 264/40.2 |
| 4,257,991 | 3/1981 | Kirjavainen | 264/40.2 |

OTHER PUBLICATIONS

Bierenfeld et al.: "Capacitance Probe for . . . Controlling Coaxial Capacitance of Insulated Conductors"-*Inspec.-Tech. Digest*, No. 44-pp. 7, 8.

*Primary Examiner*—Stanley T. Krawczewicz
*Assistant Examiner*—Jose M. Solis

[57] ABSTRACT

In a process and device for measuring the specific capacity of an electric cable by means of a cylindrical measuring electrode through which the cable is passed and between which and the cable conductor an alternating voltage is maintained, the capacitative current flowing between the cable conductor and a defined length of the electrode is determined by measurement of the currents flowing in the cable conductor at respective points located adjacent the ends of the defined length of the electrode, and obtaining the difference between the currents. This avoids the need for direct measurement of the capacitative current and thus enables screening electrodes at each end of the measuring electrode to be directly electrically connected to or integral with the measuring electrode so that they can be maintained at the same potential as the measuring electrode without the need for special electrical circuitry. The means for sensing the currents in the cable conductor may comprise toroidal transformers having measuring windings connected in opposition, or, alternatively, they may comprise Hall-effect elements.

17 Claims, 5 Drawing Figures

FIG.2
FIG.3
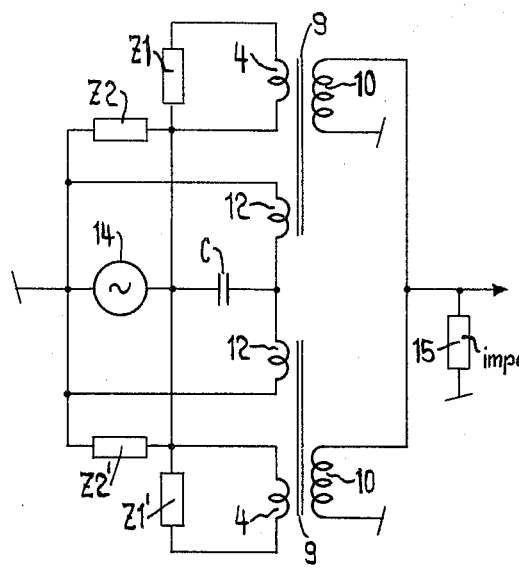
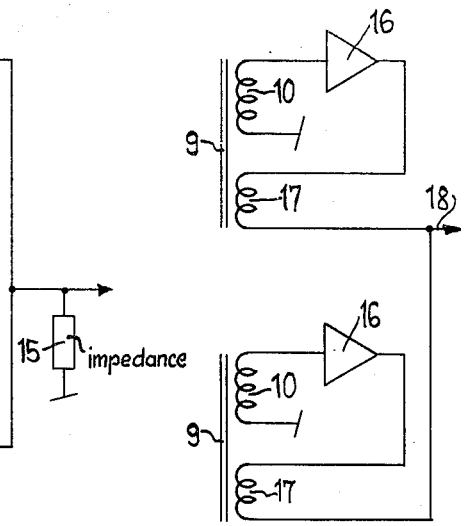
FIG.4
FIG.5
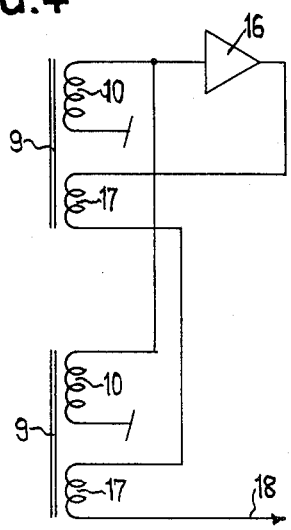
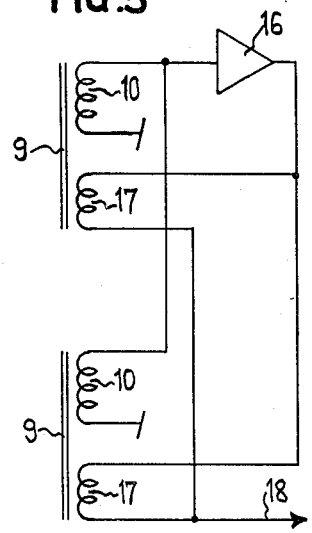

PROCESS FOR THE MEASUREMENT OF THE SPECIFIC CAPACITY OF A CABLE AND A DEVICE FOR CARRYING OUT THE PROCESS

This is a continuation of application Ser. No. 193,662 filed Oct. 3, 1980, now abandoned.

BACKGROUND OF THE INVENTION

This invention concerns a process for the measurement of the specific capacity of a cable by means of a measuring electrode and adjacent screening means arranged coaxially at both ends thereof, wherein the cable is led through the electrode in the axial direction, an alternating voltage is applied between the electrode and the cable conductor, and the capacitative current flowing between the electrode and the cable conductor is measured. The invention further concerns a device for carrying out this process.

Such measuring devices for the determination of the specific cable capacity over a defined length are already known, in the case of which the electrode and the screening means are located in a water bath. The capacity is in this case determined with the aid of the alternating current flowing in the connecting lead to the measuring electrode. This measurement is however only reliable and correct when no variations in current occur due to changes in the quality of the water, more especially the conductivity of the water.

This means that the screening means must comprise separate screen electrodes which must be maintained at a voltage corresponding exactly in amplitude and phase with the voltage on the measuring electrode, with the aid of amplifiers and corresponding networks. Also, the further screening within the measuring mechanism must be maintained at a corresponding voltage in order to prevent variation of the capacitative current between the measuring electrode and outer parts of the measuring device, for example the trough, in which the water is located. As mentioned, it is relatively difficult to maintain all of these conditions ideal, especially when the electrical characteristics of the water vary with the passage of time.

SUMMARY OF THE INVENTION

It is the object of the invention to prevent the above-mentioned difficulties. In accordance with the invention the solution of this problem consists in that the current in the cable conductor is ascertained in each case between one end of the measuring electrode and the adjacent screening electrode, and that the differences in the currents are cancelled out for the measurement of the specific capacity. By means of the process the difference in the currents occurring in the cable conductor between the two ends of the measuring electrode is measured and this difference corresponds exactly with the capacitative current flowing between the cable conductor and the measuring electrode. In this respect it should be noted that there does occur a difference between the currents of which the defined direction of flow in the cable conductor is the same.

A device in accordance with one embodiment of the invention is constructed in such a manner that an oscillator is connected with the measuring electrode and the screening electrodes, that the cable conductor is at least on one side connected to earth by way of an impedance and passes through two transformers of which the output circuits are connected in opposition to one another and are connected with a measuring device. By this means, as is further indicated below, an unusually simple construction is rendered possible. It will be understood that the arrangement in accordance with the invention is fully symmetrically constructed, that is to say that possible additional capacitative current, which passes through the current transformer and can induce magnetic flux in the same, is fully symmetrical so that its effect is fully self-compensating.

The possible influence of such currents, which may also comprise an ohmic portion as a result of the conductivity of the water, are preferably further removed in that each ring core carries a feedback winding, which is connected with the output of a measuring amplifier. Thereby the magnetic fields in the ring cores and the voltages and currents respectively which are induced in the measuring transformers are reduced to a minimum, whereby possible disturbing influences of the mentioned extraneous or stray currents can be further reduced.

The solution in accordance with the invention now enables an extremely simple construction of the measuring device, in which the screening electrodes can each be directly connected with the measuring electrode by way of the conductor surrounding the outside of the adjacent ring core. All the above-mentioned amplifiers and networks for supplying the screening electrodes with a voltage exactly corresponding with the voltage on the measuring electrode become redundant.

The arrangement can be further simplified and the influence of possible asymmetrical stray currents yet further checked if the ring cores are arranged inside the electrodes, rather than outside, between the said electrodes and the cable.

Although a current transformer with measuring winding renders possible an advantageous solution, the current can also be determined by other means. For example, Hall-effect elements can be inserted in holes in the ring core of the transformer and their output circuits connected in opposition to one another.

BRIEF DESCRIPTION OF THE DRAWINGS

FIG. 2 shows an equivalent electrical diagram of the measuring device, and FIGS. 3 to 5 show measuring and feedback coupling circuits.

DESCRIPTION OF THE PREFERRED EMBODIMENTS

Figure 1:
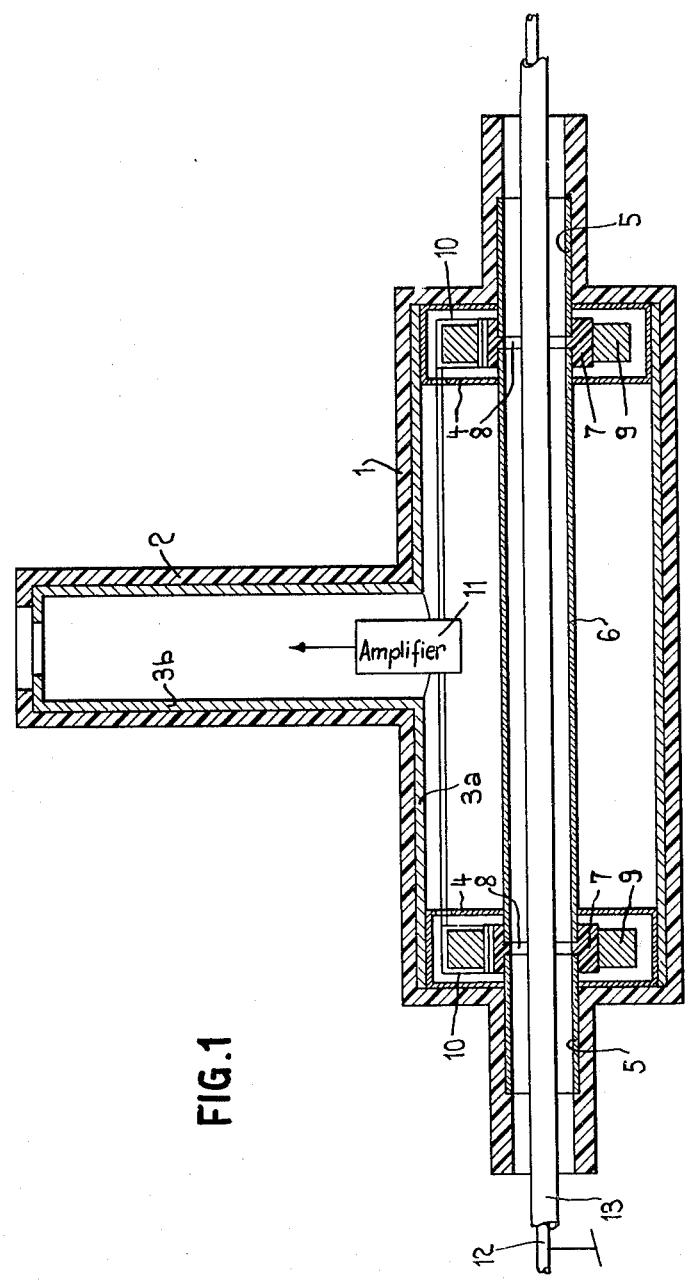
FIG. 1 shows a partly diagrammatic longitudinal section through the measuring device.

The measuring device shown in FIG. 1 comprises a system of directly interconnected conductors and electrodes within a synthetic plastics casing 1 with a support 2. A connecting and supply conductor which also acts as a screen, comprises a cylindrical part 3a corresponding with the shape of the housing 1 and a part 3b matched to the shape of the support 2. At the ends of the conductor portion 3a are arranged conductive rings 4 of U-shaped cross-section, the outer flange of each ring being connected with a cylindrical, outer screening electrode 5 and the inner flange being connected with an intermediate cylindrical measuring electrode 6. The electrodes 5 and 6 are of equal diameter and are arranged coaxially. The electrodes 5 and 6 are connected with each other by way of a ring 7 of insulating material, but are electrically isolated from one another, so that a gap 8 of exactly equal breadth and axial length respectively exists between the measuring electrode and each of the screening electrodes 5. Symmetrically with each of the gaps 8 and outside of the same are arranged in each case ring cores 9 of a current transformer, which ring cores carry at one position a measuring winding 10 with a measured number of turns. The connecting leads of these measuring windings 10 are led through openings of the rings 4 and connected with a measuring amplifier 11 arranged within the housing. The diagrammatically illustrated connections and windings may comprise further conductors and in each case a feedback winding, to be described below. The cable, of which the conductor 12 and the insulation 13 are shown, is fed through the electrodes 5 and 6 in the longitudinal direction, that is to say the axial direction. The conductor 3a is advantageous but not, however, strictly necessary.

FIG. 2 shows an electrical circuit diagram for illustrating the functional operation of the measuring device according to FIG. 1. The circuits comprises an oscillator 14, which applies between the earth and the electrically conducting parts 3a, 3b, 4, 5 and 6 in the housing 1, 2, a defined voltage with a frequency of, for example 20 kHz. The electrically conducting vessel which contains the water and the device according to FIG. 1 which is immersed therein, is also connected to earth. The capacitance C indicates the capacity between the measuring electrode 6 and the cable conductor 12, which is to be measured. The cable conductor 12 acts as a primary winding 12 of each of the two ring cores 9, while the two windings 10 form the secondary measuring windings. They are arranged in opposition in the output current circuit and loaded by way of an impedance 15. The output is connected with an amplifier not shown in FIG. 2 and a measuring device for ascertaining the current difference. The conductive rings 4 form a further secondary winding on each of the ring cores 9. The impedances between the measuring electrode 6 and each one of the screening electrodes 5 are indicated at Z1 and Z1', while each impedance between one of the screen electrodes and the outer vessel or trough of the measuring arrangement is indicated by Z2 or Z2'.

As already mentioned, during the measuring process an alternating voltage of relatively high frequency is applied to the measuring electrode 6 and also to the screening electrodes 5, by way of the rings 4. The screening electrodes have the function of exactly limiting the boundaries of the electric field existing between the measuring electrode 6 and the cable conductor 12, which is at least on one side connected to earth by way of a sufficiently small impedance, so that the length to be measured is sufficiently accurately fixed. The capacitative currents flowing between the electrodes 5 and 6 and the cable conductor 12 all reach the earthed end thereof by way of the cable conductor. The capacitative current from the shielding electrode at the outer right-hand end flows through the ring core on the right in FIG. 1. The sum of the capacitative currents from the shielding electrode on the right-hand side and from the measuring electrode 6 flow through the ring core 9 of the measuring transformer which is on the left-hand side in FIG. 1. Since the capacitative current from the shielding electrode on the right-hand side flows in both measuring transformers, these currents cancel one another during the measurement and the current at the output corresponds to the capacitative current between the measuring electrode 6 and the cable conductor. The currents in the impedances Z2 and Z2' do not influence the current transformer and thus the measurement. A certain problem arises on account of the fact that the ring 4 forms a secondary winding which has an effect on the impedance Z1 or Z1' respectively. Since this impedance is dependent upon the electrical characteristics of the water, there is a not fully constant influence on the measurement which must be restricted. It is therefore necessary to maintain the transformed impedance of Z1 and Z1' respectively as small as possible. This can be achieved as shown in FIGS. 3, 4 and 5, in which the measuring transformer is provided with a feedback winding. According to FIG. 3 the secondary windings 10 are each respectively connected with the input of an amplifier 16, of which the output is connected with the common output 18 by way of a feedback winding 17. As a result a very small impedance at input of the amplifier and a small magnetic flux in the ring core 9 is now produced, whereby with measured measuring sensitivity the influence of the secondary windings 4 and the impedances Z1 and Z1' can be maintained negligibly small.

FIG. 4 shows a corresponding arrangement with a single amplifier 16, to which the difference current of the secondary windings 10 is fed. The output of the amplifiers is connected with the common output 18 by way of two feedback windings 17 connected in series, the output 18 being connected to a measuring bridge or to a device for absolute current measurement.

FIG. 5 shows a further modification, in which an amplifier 16 is likewise provided, and of which the output is connected with the common output 18 by way of feedback windings 17 connected in parallel.

Further modifications are possible. The ring cores of the measuring transformers could be arranged within the electrodes 5 and 6, between the electrodes and the cable. In the extreme case the electrodes 5 and 6 could be replaced by a single, hollow cylindrical electrode, within which similarly constructed current transformers are inserted at predetermined distances from the ends. The parts of the electrodes located axially beyond the current transformers serve as screening electrodes, and this would, with a sufficiently long construction of the same, provide for a uniform field in the regions of the measuring transformers. With a more fixed configuration of the measuring transformer and the electrodes constantly consistent measuring conditions are produced.

It is not necessary to provide each ring core with a feedback winding. It may suffice to locate one such winding on a ring core, as long as the feedback current flowing therein is correctly measured.

I claim:

1. In a device for use in the measurement of the specific capacity of an electric cable, said device comprising a measuring electrode through which the cable can be fed in an axial direction; means for applying an alternating voltge between the said measuring electrode and the conductor of the cable; screening electrodes arranged coaxially at each side beyond said measuring electrode, whereby a uniform electric field is maintained in the region of said measuring electrode; and means for determining the capacitive current flowing between the cable conductor and said measuring electrode, the improvement wherein said current determining means comprises a pair of current sensing devices, spaced apart disposed respectively between an end of the measuring electrode and the contiguous respective screening electrode in order to enable sensing of the electric current flowing in the cable at their respective locations; and means for producing an output signal representative of the difference between the currents sensed by said sensing devices.

2. A device according to claim 1, wherein the said means for applying said alternating voltage includes an oscillator connected on the one hand to said measuring electrode and to said screening means and connected on the other hand, via an earth connection and an impedance, to the cable conductor.

3. A device according to claim 1 or 2, wherein said sensing devices comprise transformers arranged to surround said cable and of which the outputs are connected in opposition to a measuring device.

4. A device according to claim 3, wherein secondary windings of each of the transformers are connected with the input of an amplifier, the output of which is connected to a common output by way of feedback windings.

5. A device according to claim 4, wherein said secondary windings are connected in parallel with the input of said amplifier, the output of said amplifier being connected with said common output by way of two feedback windings connected in series.

6. A device according to claim 4, wherein said secondary windings are connected in parallel with the input of said amplifier, the output of said amplifier being connected with said common output by way of two feedback windings connected in parallel.

7. A device according to claim 1 or 2, wherein the said screening means comprise cylindrical screening electrodes arranged coaxially with the first measuring electrode and axially spaced from the ends thereof, and said sensing devices comprise toroidal transformers of which the ring cores are arranged in the regions between the ends of the first cylindrical electrode and the respective screening electrodes, and the outputs of which are connected in opposition to one another.

8. A device according to claim 7, wherein the screening electrodes are each directly connected with the said measuring electrode by way of a conductor surrounding the ring core of the adjacent transformer.

9. A device according to claim 8, wherein the said conductor surrounding each transformer comprises a ring-shaped conductor of U-shaped cross-section, which surrounds the electrodes.

10. A device according to claim 7, in which the ring core of at least one of the transformers has a feedback winding which is connected to the output of a measuring amplifier.

11. A device according to claim 3, wherein the said screening means comprise extensions of the said measuring electrode beyond a portion having said predetermined axial length, and wherein said transformers comprise toroidal transformers of which the ring cores are located within the measuring electrode, between the latter and the cable.

12. A device according to claim 7, wherein the outputs of said transformers are provided by way of measuring windings.

13. A device according to claim 3, wherein each of said transformers comprises a secondary winding, each of said secondary windings being connected with the input of a corresponding amplifier, the output of each of said amplifiers being connected to a common output by way of a feedback winding.

14. A device according to claim 12, wherein said measuring windings comprise a number of turns greater than one.

15. In a method for measuring the specific capacity of an electric cable having a conductor and an insulation surrounding it, by means of a cylindrical measuring electrode and screening electrodes arranged coaxially and in close proximity at each end of the said measuring electrode, said cable being fed axially through the interior of said electrodes, an alternating voltage being applied between said electrodes and said cable conductor and the capacitive current flowing between said measuring electrode and the cable conductor being measured, the improvement comprising sensing two magnetic field conditions indicative each of the current flow in a section of said cable conductor located between said measuring electrode and the one of said screening electrodes, producing signals by said sensing proportional each to one of said current flows and forming the difference based on the same defined direction of current flow in the cable conductor between said signals for obtaining a measuring signal proportional to said capacitive current.

16. A method according to claim 15, wherein the sensing of the current flowing in the cable is effected by means of toroidal transformers surrounding the cable.

17. In a device for measurement of the specific capacity of an electric cable having a conductor and an insulation surrounding it, said device comprising a measuring electrode through which the cable can be fed in an axial direction, means for applying an alternating voltage between the said measuring electrode and the conductor of the cable, screening electrodes arranged coaxially at each side beyond said measuring electrode, whereby a uniform electric field is maintained in the region of said measuring electrode and means for determining the capacitive current flowing between the cable conductor and said measuring electrode, the improvement wherein said current determining means comprises a pair of sensing devices located each for sensing a magnetic field indicative of the current flow in a section of said conductor located between said measuring electrode and one of said screening electrodes, each of said sensors adapted to produce a signal proportional to the magnetic field sensed by it, means for forming the difference based on the same defined direction of current flow in said cable conductor between said signals, this difference being indicative of said capacitive current flow between said measuring electrode and said cable conductor.

* * * * *